United States Patent
Nishimata et al.

(10) Patent No.: US 11,034,888 B2
(45) Date of Patent: Jun. 15, 2021

(54) ALUMINATE FLUORESCENT MATERIAL, LIGHT EMITTING DEVICE, AND METHOD FOR PRODUCING ALUMINATE FLUORESCENT MATERIAL

(71) Applicant: NICHIA CORPORATION, Anan (JP)

(72) Inventors: Kazuya Nishimata, Anan (JP); Tomokazu Yoshida, Anan (JP); Shoji Hosokawa, Tokushima (JP)

(73) Assignee: NICHIA CORPORATION, Anan (JP)

( * ) Notice: Subject to any disclaimer, the term of this patent is extended or adjusted under 35 U.S.C. 154(b) by 342 days.

(21) Appl. No.: 16/144,366

(22) Filed: Sep. 27, 2018

(65) Prior Publication Data

US 2019/0100694 A1 Apr. 4, 2019

(30) Foreign Application Priority Data

Sep. 29, 2017 (JP) .............................. JP2017-190044

(51) Int. Cl.
| | | |
|---|---|---|
| *C09K 11/77* | (2006.01) | |
| *C09K 11/08* | (2006.01) | |
| *H01L 23/00* | (2006.01) | |
| *H01L 33/50* | (2010.01) | |

(52) U.S. Cl.
CPC ...... *C09K 11/7734* (2013.01); *C09K 11/0838* (2013.01); *H01L 24/49* (2013.01); *H01L 33/502* (2013.01); *H01L 2224/32245* (2013.01); *H01L 2224/48247* (2013.01); *H01L 2224/48257* (2013.01); *H01L 2224/4909* (2013.01); *H01L 2224/73265* (2013.01); *H01L 2924/00014* (2013.01); *H01L 2924/12041* (2013.01)

(58) Field of Classification Search
CPC ..................... C09K 11/7734; C09K 11/0838
See application file for complete search history.

(56) References Cited

U.S. PATENT DOCUMENTS

| | | | | |
|---|---|---|---|---|
| 2010/0090585 A1* | 4/2010 | Seto | ........................ | C04B 35/44 313/503 |
| 2011/0182072 A1 | 7/2011 | Shimizu et al. | | |
| 2018/0086975 A1* | 3/2018 | Taketomi | .............. | H01L 33/502 |

FOREIGN PATENT DOCUMENTS

| | | |
|---|---|---|
| JP | 2004155907 A | 6/2004 |
| JP | 2007254638 A | 10/2007 |
| JP | 2008274254 A | 11/2008 |
| WO | 2008123498 A1 | 10/2008 |
| WO | 2009005035 A1 | 1/2009 |

* cited by examiner

*Primary Examiner* — C Melissa Koslow
(74) *Attorney, Agent, or Firm* — Hunton Andrews Kurth LLP

(57) ABSTRACT

Provided are an aluminate fluorescent material, a light emitting device, and a method for producing an aluminate fluorescent material. The aluminate fluorescent material, having an aluminate composition containing: at least one alkaline earth metal element selected from the group consisting of Ba, Sr, and Ca; Mn; and optionally Eu and/or Mg, wherein the fluorine content in the aluminate fluorescent material is 100 ppm or more and 7,000 ppm or less, and the average particle diameter of the aluminate fluorescent material, which is measured according to a Fisher Sub-Sieve Sizer method, is 8 μm or more.

7 Claims, 2 Drawing Sheets

ALUMINATE FLUORESCENT MATERIAL, LIGHT EMITTING DEVICE, AND METHOD FOR PRODUCING ALUMINATE FLUORESCENT MATERIAL

CROSS-REFERENCE TO RELATED PATENT APPLICATION

This application claims priority to Japanese Patent Application No. 2017-190044, filed on Sep. 29, 2017, the disclosure of which is hereby incorporated reference in its entirety.

BACKGROUND

Technical Field

The present invention relates to an aluminate fluorescent material, a light emitting device, and a method for producing an aluminate fluorescent material. In this specification the "fluorescent material" is used in the same meaning as a "fluorescent phosphor".

Description of Related Art

Various light emitting devices that emit white light, bulb color light, or orange light by a combination of a light emitting diode (LED) and a fluorescent material have been developed. In these light emitting devices, a desired luminescent color can be obtained according to the principle of light color mixing. As a light emitting device, one that emits white light by combination of a light emitting element to emit blue color as an excitation light source, and a fluorescent material to emit green color and a fluorescent material to emit red color when excited by the light from the light source, is known.

Use of these light emitting devices in a broad field of ordinary lightings, in-car lightings, displays, backlights for liquid crystals and others is being promoted.

As a fluorescent material that emits green color for use in light emitting devices, for example, Japanese Unexamined Patent Publication No. 2004-155907 discloses a manganese-activated aluminate fluorescent material having a composition represented by $(Ba, Sr)MgAl_{10}O_{17}:Mn^{2+}$.

SUMMARY

However, the manganese-activated aluminate fluorescent material disclosed in Japanese Unexamined Patent Publication No. 2004-155907 emits light having a high light emission luminance through vacuum ultraviolet excitation at, for example, 146 nm; and is, when combined with a light emitting element that emits light having a light emission peak wavelength in a range of 380 nm or more and 485 nm or less (hereinafter also referred to as "blue region"), insufficient in light emission luminance.

Consequently, an object of the present disclosure is to provide an aluminate fluorescent material capable of having a high light emission intensity through photoexcitation in the blue region; a light emitting device; and a method of producing the aluminate fluorescent material.

The present disclosure includes the following embodiments.

A first embodiment of the present disclosure relate to an aluminate fluorescent material comprising an aluminate composition comprising: at least one alkaline earth metal element selected from the group consisting of Ba, Sr, and Ca; Mn; and optionally Eu and/or Mg, wherein the fluorine content in the aluminate fluorescent material is 100 ppm or more and 7,000 ppm or less, and the average particle diameter, which is measured according to a Fisher Sub-Sieve Sizer method, is 8 μm or more.

A second embodiment of the present disclosure relate to a light emitting device comprising: a fluorescent member comprising the aluminate fluorescent material; and an excitation light source having a light emission peak wavelength in a range of 380 nm or more and 485 nm or less.

A third embodiment of the present disclosure relate to a method for producing an aluminate fluorescent material comprising: mixing a compound containing at least one alkaline earth metal element selected from the group consisting of Ba, Sr, and Ca, a compound containing Mn, optionally a compound containing Eu, a compound containing Al, optionally a compound containing Mg, a first flux, which is a fluoride containing at least one alkaline metal element selected from the group consisting of Na, K, Rb, and Cs, and a second flux, which is a fluoride containing at least one element selected from the group consisting of Ba, Sr, Ca, Mg, and Al, wherein the fluoride is different from the compound containing the alkaline earth metal element, the compound containing Mg, and the compound containing Al (excluding the case where the first flux is a fluoride containing K and the second flux is a fluoride containing Al), to obtain a mixture in which the fluoride content is in a range of 3,000 ppm or more and 15,500 ppm or less; and heat-treating the mixture.

A fourth embodiment of the present disclosure relate to a method of producing an aluminate fluorescent material comprising: mixing a compound containing at least one alkaline earth metal element selected from the group consisting of Ba, Sr, and Ca, a compound containing Mn, optionally a compound containing Eu, a compound containing Al, optionally a compound containing Mg, a first flux, which is a fluoride containing K, and a second flux, which is a fluoride containing Al, wherein the fluoride is different from the compound containing Al, to obtain a mixture in which the fluoride content is in a range of 3,000 ppm or more and 8,500 ppm or less; and heat-treating the mixture.

In accordance with the embodiments of the present disclosure, an aluminate fluorescent material having a high light emission intensity; and a light emitting device having a high light emission intensity through photoexcitation in the blue region, can be provided.

DETAILED DESCRIPTION

Figure 1:
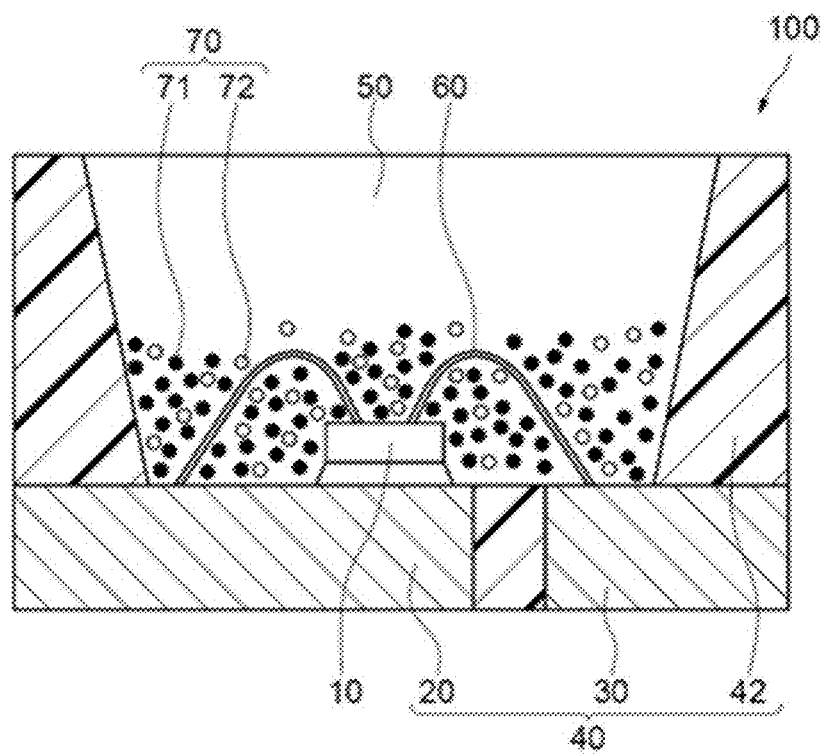
FIG. 1 is a schematic cross-sectional view showing one example of a light emitting device according to an embodiment of the present disclosure.

Embodiments of the present invention will be hereunder described. The embodiments shown below are exemplifications for exemplifying the technical idea of the present invention, and the present invention is not limited to the aluminate fluorescent material, the light emitting device using the same, and the method for producing an aluminate fluorescent material mentioned below. Standards according to JIS Z8110 are applied to the relations between color names and chromaticity coordinates, the relations between wavelength ranges of light and color names of monochromatic lights.

Aluminate Fluorescent Material

A first embodiment of the present disclosure is an aluminate fluorescent material having an aluminate composition comprising: at least one alkaline earth metal element selected from the group consisting of Ba, Sr, and Ca; Mn; and optionally Eu and/or Mg, wherein the fluorine content in the aluminate fluorescent material is in a range of 100 ppm or more and 7,000 ppm or less, and the average particle diameter, which is measured according to a Fisher Sub-Sieve Sizer method, is 8 μm or more.

It is preferred that the composition of the aluminate fluorescent material is represented by the following formula (I).

$$X^1_p Eu_t Mg_q Mn_r Al_s O_{p+t+q+r+1.5s} \quad (I)$$

wherein $X^1$ represents at least one element selected from the group consisting of Ba, Sr, and Ca; and p, q, r, s, and t each satisfy $0.5 \leq p \leq 1.0$, $0 \leq q \leq 0.7$, $0.3 \leq r \leq 0.7$, $8.5 \leq s \leq 13.0$, $0 \leq t \leq 0.5$, $0.5 \leq p+t \leq 1.2$, and $0.3 < q+r \leq 1.0$.

In the formula (I), the element $X^1$ preferably contains Ba. When the aluminate fluorescent material contains Ba in the formula (I), the light emission intensity through photoexcitation in the blue region can be higher.

The parameter p in the formula (I) indicates a total molar ratio of at least one element $X^1$ selected from the group consisting of Ba, Sr, and Ca. The term 'molar ratio' of a parameter in the formula (I) refers to the molar amount of an element in one mole of the chemical composition of the aluminate fluorescent material represented by the formula (I). When the parameter p satisfies $0.5 \leq p \leq 1.0$ in the formula (I), the crystal structure in the aluminate fluorescent material can be more stable, and a light emission intensity can be higher. The parameter p is preferably 0.60 or more, more preferably 0.80 or more. The parameter p may be 0.999 or less. From the viewpoint of stability of the crystal structure in the aluminate fluorescent material, the parameter p preferably satisfies $0.6 \leq p \leq 1.0$ in the formula (I).

The parameter q in the formula (I) indicates a molar ratio of Mg. When the parameter q satisfies $0 \leq q \leq 0.7$ in the formula (I), a sufficient amount of an activating element can be contained in the aluminate fluorescent material, and the light emission intensity can be higher. The aluminate fluorescent material may not contain Mg. The parameter q in the formula (I) preferably satisfies $0 \leq q \leq 0.7$, more preferably $0 \leq q \leq 0.6$. The lower limit of the parameter q in the formula (I) is even more preferably 0.05, and still more preferably 0.1. In the aluminate fluorescent material, when the parameter q in the formula (I) satisfies $0 \leq q \leq 0.7$, the light emission spectrum through photoexcitation in the blue region has a light emission peak wavelength in a range of 510 nm or more and 525 nm or less, the reflectance at 450 nm is relatively low, and the light emission intensity tends to be higher.

The parameter r in the formula (I) indicates a molar ratio of Mn. Mn is an activating element in the aluminate fluorescent material. The aluminate fluorescent material contains Mn as an activating element, and may contain rare earth elements such as Eu and Ce in addition to Mn. When the parameter r satisfies $0.3 \leq r \leq 0.7$ in the formula (I), concentration quenching caused by too much amount of activation elements never occurs. In addition, a lowering of the light emission intensity caused by too small amount of activation elements never occurs, and the light emission intensity of the aluminate fluorescent material can be higher. In the formula (I), the parameter r preferably satisfies $0.35 \leq r \leq 0.7$, more preferably $0.4 \leq r \leq 0.7$, even more preferably $0.4 \leq r \leq 0.6$.

The parameter t in the formula (I) indicates a molar ratio of Eu. Eu is an activating element in the aluminate fluorescent material. The aluminate fluorescent material may not contain Eu. When the parameter t satisfies $0 \leq t \leq 0.5$ in the formula (I), concentration quenching caused by too much amount of activation elements never occurs, and the light emission intensity of the aluminate fluorescent material can be higher. Since Eu efficiently absorbs light in the blue region emitted from the excitation light source, when the aluminate fluorescent material contains Eu, it is presumed that Eu may absorb the light in the blue region to excite electrons and the resultant excitation energy may be transmitted from Eu to Mn, thereby contributing toward emission by Mn. Thus, the aluminate fluorescent material preferably contains Eu, and in the formula (I), the parameter t preferably satisfies $0 \leq t \leq 0.5$, more preferably $0.001 \leq t \leq 0.2$.

The total of the parameter p and the parameter t in the formula (I) (hereinafter referred to as "p+t" in some cases) indicates a total molar ratio of at least one alkaline earth metal element $X^1$ selected from the group consisting of Ba, Sr, and Ca; and Eu that is optionally contained. When the value of p+t satisfies $0.5 \leq p+t \leq 1.2$ in the formula (I), the crystal structure in the aluminate fluorescent material can be more stable, and the light emission intensity can be higher. The value of p+t is preferably 0.55 or more, more preferably 0.60 or more. Also, the value of p+t is preferably 1.10 or less, more preferably 1.05 or less.

The total of the parameter q and the parameter r in the formula (I) (hereinafter referred to as "q+r" in some cases) indicates a total molar ratio of Mg and Mn. When the value of q+r satisfies $0.3 < q+r \leq 1.0$ in the formula (I), the crystal structure in the aluminate fluorescent material can be more stable, and the light emission intensity can be higher. The value of q+r is preferably more than 0.3, more preferably 0.4 or more. The value of q+r may be 0.99 or less, and may be 0.98 or less.

The total of the parameter r and the parameter t in the formula (I) (hereinafter referred to as "r+t" in some cases) indicates a total molar ratio of Mn as an activating element and Eu, which is optionally contained, as an activating element. In the formula (I), the value of r+t preferably satisfies $0.3 \leq r+t \leq 0.7$. When the value of r+t satisfies $0.3 \leq r+t \leq 0.7$, a lowering of the light emission intensity caused by too small amount of activation elements contained in the aluminate fluorescent material never occurs. In addition, concentration quenching caused by too much amount of activation elements contained in the aluminate fluorescent material never occurs, and when excited with light, for example, in the blue region, the light absorption is increased, and the light emission intensity can be higher.

The parameter s in the formula (I) indicates a molar ratio of Al. When the parameter s satisfies $8.5 \leq s \leq 13.0$ in the formula (I), the crystal structure in the aluminate fluorescent material may be more stable, and if so, when the aluminate fluorescent material is excited, for example, with light falling in the blue region, the light emission intensity can be higher. In the formula (I), the parameter s preferably satisfies $9.0 \leq s \leq 13.0$, and the parameter s is more preferably 12.0 or less, even more preferably 11.0 or less.

Fluorine Content in Aluminate Fluorescent Material

The aluminate fluorescent material may be produced using a flux such as a halide in order to enhance the reactivity of the raw materials. In the case of using a flux containing an alkali metal element, a tiny amount of the alkali metal element may be detected from the aluminate fluorescent material. Even in such a case, it is preferred that the aluminate fluorescent material has an aluminate composition containing: at least one alkaline earth metal element selected from the group consisting of Ba, Sr, and Ca; Mn; and optionally Eu and/or Mg, and it is more preferred that the aluminate fluorescent material has a composition represented by the formula (I). The fluorine content in the aluminate fluorescent material is in a range of 100 ppm or more and 7,000 ppm or less, and is preferably in a range of 200 ppm or more and 6,000 ppm or less, more preferably in a range of 300 ppm or more and 5,500 ppm or less, even more preferably in a range of 400 ppm or more and 5,000 ppm or less, still more preferably in a range of 500 ppm or more and 5,000 ppm or less. When the fluorine content in the aluminate fluorescent material is more than 7,000 ppm, the light emission intensity may be rather decreased, for example, by the occurrence of dullness.

Average Particle Diameter Measured According to FSSS Method

In the aluminate fluorescent material, an average particle diameter that is measured according to a Fisher Sub-Sieve Sizer (FSSS) method (hereinafter referred to as "average particle diameter D" in some cases) is 8 µm or more, and is preferably 8.5 µm or more, more preferably 9 µm or more, even more preferably 10 µm or more. When the average particle diameter of the aluminate fluorescent material is less than 8 µm, absorption of the light emitted from the excitation light source is lowered, and the light emission intensity may be decreased. When the fluorine content in the aluminate fluorescent material falls in a range of 100 ppm or more and 7,000 ppm or less, reaction among the raw materials can be promoted by the flux, the average particle diameter D of the aluminate fluorescent material can be increased to be 8 µm or more. Therefore the aluminate fluorescent material efficiently absorbs the light emitted from the excitation light source, and the light emission intensity can be further increased. The FSSS method is a type of an air permeability method and a method for measuring a specific surface area by utilizing the flow resistance of air to determine a particle diameter. The average particle diameter D according to the FSSS method can be measured using a Fisher Sub-Sieve Sizer Model 95 (manufactured by Fisher Scientific Inc.). It is preferred that the average particle diameter D of the aluminate fluorescent material (I), which is measured according to the FSSS method, is large, and is generally 50 µm or less, and preferably 30 µm or less, more preferably 25 µm or less from the viewpoint of the easiness in manufacturing.

50% Volume Particle Diameter D50

In the aluminate fluorescent material, a 50% volume particle diameter D50 at a cumulative volume frequency of 50% from the small-diameter side in the particle size distribution on a volume basis, which is measured by a laser diffraction particle size distribution measuring method, is preferably 15 µm or more and 50 µm or less. The laser diffraction particle size distribution measuring method is a method of measuring a particle size irrespective of primary particles and secondary particles by using the scattered light from the laser light radiated to particles. The 50% volume particle diameter D50 by the laser diffraction particle size distribution measuring method can be measured using a laser diffraction particle size distribution measuring apparatus (Mastersizer 3000, manufactured by Malvern Instruments Ltd.). The closer the values of the average particle diameter D and the 50% volume particle diameter D50 are, the smaller the number of coagulated particles is. When the average particle diameter D of the aluminate fluorescent material is 8 µm or more and the 50% volume particle diameter thereof is in a range of 15 µm or more and 50 µm or less, a lowering of the light emission intensity caused by coagulated particles is suppressed. Therefore, for example, the aluminate fluorescent material efficiently absorbs the light in the blue region emitted from the excitation light source, and the light emission intensity can be further increased. The 50% volume particle diameter D50 of the aluminate fluorescent material is more preferably in a range of 15 µm or more and 40 µm or less, even more preferably in a range of 15 µm or more and 30 µm or less, still more preferably in a range of 16 µm or more and 25 µm or less.

In the aluminate fluorescent material according to the first embodiment of the present disclosure, a full width at half maximum (FWHM) of the light emission peak in the light emission spectrum, which is obtained through excitation of the light in the blue region emitted from the excitation light source, for example, through excitation of the light having a light emission peak wavelength of 450 nm, is preferably 45 nm or less, more preferably 40 nm or less, even more preferably 38 nm or less. A full width at half maximum (FWHM) indicates a wavelength width of the light emission peak showing a value of 50% of the maximum light emission peak of the light emission spectrum. When the full width at half maximum (FWHM) of the aluminate fluorescent material is narrow, the color purity increases. When the light emitting device having a fluorescent member including the aluminate fluorescent material and an excitation light source having a light emission peak wavelength in a range of 380 nm or more and 485 nm or less is used, for example, as backlights for liquid crystals, the color reproducibility range can be broadened.

The aluminate fluorescent material according to the first embodiment of the present disclosure emits green light through photoexcitation in the blue region. Specifically, the aluminate fluorescent material absorbs light falling within a wavelength range of 380 nm or more and 485 nm or less, and the light emission peak wavelength in the light emission spectrum thereof preferably falls in a range of 485 nm or more and 570 nm or less, more preferably in a range of 495 nm or more and 560 nm or less, even more preferably in a range of 505 nm or more and 550 nm or less, still more preferably in a range of 510 nm or more and 525 nm or less.

Light Emitting Device

An example of a light emitting device comprising a fluorescent member containing the aluminate fluorescent material according to the second embodiment of the present disclosure and an excitation light source having a light emission peak wavelength in a range of 380 nm or more and 485 nm or less, is described with reference to FIG. 1. FIG.

1 is a schematic cross-sectional view showing a light emitting device 100 according to the second embodiment of the present disclosure.

The light emitting device 100 comprises a molded body 40, a light emitting element 10, and a fluorescent member 50. The molded body 40 is constituted by integrally forming a first lead 20, a second lead 30, and a resin part 42 containing a thermoplastic resin or a thermosetting resin. The molded body 40 forms a concave part having a bottom face and a side face, and the light emitting element 10 is mounted on the bottom face of the concave part. The light emitting element 10 has a pair of positive and negative electrodes, and the pair of positive and negative electrodes each are individually electrically connected to the first lead 20 and the second lead 30 each via a wire 60. The light emitting element 10 is covered with the fluorescent member 50. The fluorescent member 50 contains, for example, a fluorescent material 70 for wavelength conversion of the light from the light emitting element 10, and a resin. Further, the fluorescent material 70 contains a first fluorescent material 71 and a second fluorescent material 72. The first fluorescent material contains the aluminate fluorescent material according to the first embodiment of the present disclosure, and the aluminate fluorescent material preferably comprises a composition represented by the formula (I). The first lead 20 and the second lead 30 connected to the pair of positive and negative electrodes of the light emitting element 10 are partly exposed toward the outside of the package constituting the light emitting device 100. Via these first lead 20 and second lead 30, the light emitting device 100 receives external power to emit light.

The light emitting element 10 is used as an excitation light source, and preferably has a light emission peak in a wavelength range of 380 nm or more and 485 nm or less. The range of the light emission peak wavelength of the light emitting element 10 is more preferably in a range of 390 nm or more and 480 nm or less, even more preferably in a range of 420 nm or more and 470 nm or less. The aluminate fluorescent material is efficiently excited by the light emitted from the excitation light source having a light emission peak wavelength in a range of 380 nm or more and 485 nm or less, and has a high light emission intensity. By using the aluminate fluorescent material, the light emitting device 100 that can emit mixed-color light of the light from the light emitting element 10 and the fluorescence from the fluorescent material 70, can be constituted.

The light emitting element 10 preferably uses, for example, a semiconductor light emitting element using a nitride-based semiconductor ($In_XAl_YGa_{1-X-Y}N$, $0≤X$, $0≤Y$, $X+Y≤1$). By using the semiconductor light emitting element as the light emitting element 10, a stable light emitting device having high efficiency, high linearity of output to input, and high mechanical impact resistance can be obtained. A full width at half maximum of the light emission spectrum of the light emitting element 10 can be, for example, 30 nm or less.

The light emitting device 100 comprises a fluorescent member containing at least the aluminate fluorescent material according to the first embodiment of the present disclosure and an excitation light source having a light emission peak wavelength in a range of 380 nm or more and 485 nm or less. The aluminate fluorescent material preferably comprises a composition represented by the formula (I).

The first fluorescent material 71 mainly contains the aluminate fluorescent material according to the first embodiment of the present disclosure, and is contained, for example, in the fluorescent member 50 covering the light emitting element 10. In the light emitting device 100 in which the light emitting element 10 is covered by the fluorescent member 50 containing the first fluorescent material 71, a portion of light emitted from the light emitting element 10 is absorbed in the aluminate fluorescent material and is re-emitted as green light. By using the light emitting element 10 configured to emit light having a light emission peak wavelength in a range of 380 nm or more and 485 nm or less, a light emitting device having a high light emission efficiency can be provided.

The content of the first fluorescent material 71 may be, for example, in a range of 10 parts by mass or more and 200 parts by mass or less relative to the resin of 100 parts by mass, and is preferably in a range of 2 parts by mass or more and 40 parts by mass or less.

The fluorescent member 50 preferably contains the second fluorescent material 72 whose light emission peak wavelength differs from that of the first fluorescent material 71. For example, the light emitting device 100 is provided with the light emitting element 10 that emits light having a light emission peak wavelength in a range of 380 nm or more and 485 nm or less, and adequately the first fluorescent material 71 and the second fluorescent material 72 to be excited by the light, and consequently, the light emitting device 100 can have a broad color reproducibility range and good color rendering properties.

The second fluorescent material 72 may be any one that absorbs light emitted from the light emitting element 10 and converts the light into light having a wavelength different from that of the first fluorescent material 71. Examples thereof may include $(Ca,Sr,Ba)_2SiO_4:Eu$, $(Ca,Sr,Ba)_8MgSi_4O_{16}(F,Cl,Br)_2:Eu$, $Si_{6-z}Al_zO_zN_{8-z}:Eu$ ($0<z≤4.2$), $(Sr,Ba,Ca)Ga_2S_4:Eu$, $(Lu,Y,Gd,Lu)_3(Ga,Al)_5O_{12}:Ce$, $(La,Y,Gd)_3Si_6N_{11}:Ce$, $Ca_3Sc_2Si_3O_{12}:Ce$, $CaSc_4O_4:Ce$, $K_2(Si,Ge,Ti)F_6:Mn$, $(Ca,Sr,Ba)_2Si_5N_8:Eu$, $CaAlSiN_3:Eu$, $(Ca,Sr)AlSiN_3:Eu$, $(Sr,Ca)LiAl_3N_4:Eu$, $(Ca,Sr)_2Mg_2Li_2Si_2N_6:Eu$, and $3.5MgO.0.5MgF_2.GeO_2:Mn$.

In the case where the fluorescent member 50 further contains the second fluorescent material 72, the second fluorescent material 72 is preferably a red fluorescent material that emits red color light, and it is preferable to absorb light in a wavelength range of 380 nm or more and 485 nm or less and to emit light in a wavelength range of 610 nm or more and 780 nm or less. By containing the red fluorescent material, the light emitting device can be more favorably applied to lighting systems, liquid crystal display devices.

Examples of the red fluorescent material may include a Mn-activated fluorescent material having a composition represented by $K_2SiF_6:Mn$ or $3.5MgO.0.5MgF_2.GeO_2:Mn$, and an Eu-activated nitride fluorescent material having a composition represented by $CaSiAlN_3:Eu$, $(Ca,Sr)AlSiN_3:Eu$, or $SrLiAl_3N_4:Eu$. Among these, from the viewpoint of increasing the color purity and broadening the color reproducibility range, the red fluorescent material is preferably a Mn-activated fluoride fluorescent material of which a full width at half maximum of the light emission spectrum is 20 nm or less.

The first fluorescent material 71 and the second fluorescent material 72 (hereinafter the two may be simply referred to as "fluorescent material 70") constitute the fluorescent member 50 that covers the light emitting element along with a sealing material. Examples of the sealing material for constituting the fluorescent member 50 may include thermosetting resins such as a silicone resin and an epoxy resin.

Method for Producing Aluminate Fluorescent Material

Next, methods for producing the aluminate fluorescent material according to the embodiments of the present disclosure will be described.

A method for producing an aluminate fluorescent material according to the third embodiment of the present disclosure includes: mixing a compound containing at least one alkaline earth metal element selected from the group consisting of Ba, Sr, and Ca, a compound containing Mn, optionally a compound containing Eu, a compound containing Al, optionally a compound containing Mg, a first flux, which is a fluoride containing at least one alkaline metal element selected from the group consisting of Na, K, Rb, and Cs, and a second flux, which is a fluoride containing at least one element selected from the group consisting of Ba, Sr, Ca, Mg, and Al, wherein the fluoride is different from the compound containing the alkaline earth metal element, the compound containing Mg, and the compound containing Al (excluding the case where the first flux is a fluoride containing K and the second flux is a fluoride containing Al), to obtain a mixture; and heat-treating the mixture, in which the fluoride content is in a range of 3,000 ppm or more and 15,500 ppm or less. The method of producing an aluminate fluorescent material according to the third embodiment of the present disclosure includes obtaining an aluminate fluorescent material having an aluminate composition comprising: at least one alkaline earth metal element selected from the group consisting of Ba, Sr, and Ca; Mn; and optionally Eu and/or Mg, wherein the fluorine content is in a range of 100 ppm or more and 7,000 ppm or less, and the average particle diameter, which is measured according to the FSSS method, is 8 μm or more.

A method of producing an aluminate fluorescent material according to the fourth embodiment of the present disclosure includes: mixing a compound containing at least one alkaline earth metal element selected from the group consisting of Ba, Sr, and Ca, a compound containing Mn, optionally a compound containing Eu, a compound containing Al, optionally a compound containing Mg, a first flux, which is a compound containing K, and a second flux, which is a fluoride containing Al, wherein the fluoride is different from the compound containing Al, to obtain a mixture in which the fluoride content is in a range of 3,000 ppm or more and 8,500 ppm or less; and heat-treating the mixture. The fluoride containing Al is a fluoride different from the compound containing the alkaline earth metal and the compound containing Mg. The method for producing an aluminate fluorescent material according to the fourth embodiment of the present disclosure includes obtaining an aluminate fluorescent material having an aluminate composition comprising: at least one alkaline earth metal element selected from the group consisting of Ba, Sr, and Ca; Mn; and optionally Eu and/or Mg, wherein the fluorine content in the aluminate fluorescent material is in a range of 100 ppm or more and 7,000 ppm or less, and the average particle diameter, which is measured according to the FSSS method, is 8 μm or more.

In the aluminate fluorescent material obtained by the producing method according to the third or the fourth embodiment of the present disclosure, the aluminate composition is preferably represented by the following formula (I).

(I)

wherein $X^1$ represents at least one element selected from the group consisting of Ba, Sr, and Ca; and p, q, r, s, and t each satisfy $0.5 \leq p \leq 1.0$, $0 \leq q \leq 0.7$, $0.3 \leq r \leq 0.7$, $8.5 \leq s \leq 13.0$, $0 \leq t \leq 0.5$, $0.5 \leq p+t \leq 1.2$, and $0.3 < q+r \leq 1.0$.

Compound Containing Alkaline Earth Metal Element

Examples of the compound containing at least one alkaline earth metal element selected from the group consisting of Ba, Sr, and Ca may include an oxide, a hydroxide, a carbonate, a nitrate, a sulfate, a carboxylate, a halide, and a nitride, each containing at least one alkaline earth metal element selected from the group consisting of Ba, Sr, and Ca. These compounds may be in the form of a hydrate. Specifically, the compound may include BaO, $Ba(OH)_2 \cdot 8H_2O$, $BaCO_3$, $Ba(NO_3)_2$, $BaSO_4$, $Ba(OCO)_2 \cdot 2H_2O$, $Ba(OCOCH_3)_2$, $BaCl_2 \cdot 6H_2O$, $Ba_3N_2$, BaNH, SrO, $Sr(OH)_2 \cdot 8H_2O$, $SrCO_3$, $Sr(NO_3)_2 \cdot 4H_2O$, $SrSO_4$, $Sr(OCO)_2 \cdot H_2O$, $Sr(OCOCH_3)_2 \cdot 0.5H_2O$, $SrCl_2 \cdot 6H_2O$, $Sr_3N_2$, SrNH, CaO, $Ca(OH)_2$, $CaCO_3$, $Ca(NO_3)_2$, $CaSO_4$, $Ca(OCO)_2$, $CaCl_2$, $Ca_3N_2$. One alone or two or more of these compounds may be used either singly or in combination. Among these, a carbonate and an oxide are preferred from the viewpoint of easy handleability. In particular, a carbonate containing at least one alkaline earth metal element selected from the group consisting of Ba, Sr, and Ca is more preferred. This is because, the stability the carbonate containing at least one alkaline earth metal element in air is good, the carbonate can be easily decomposed by heating, elements except the intended composition hardly remain, and the light emitting luminance can be readily prevented from being lowered by residual impurity elements.

Compound Containing Mn

Examples of the compound containing Mn may include an oxide, a hydroxide, a carbonate, a nitrate, a sulfate, a carboxylate, a halide, and a nitride, each containing Mn. These compounds containing Mn may be in the form of a hydrate. Specifically, the compound may include $MnO_2$, $Mn_2O_2$, $Mn_3O_4$, MnO, $Mn(OH)_2$, $MnCO_3$, $Mn(NO_3)_2$, $Mn(OCOCH_3)_2 \cdot 2H_2O$, $Mn(OCOCH_3)_3$, $MnCl_2 \cdot 4H_2O$. One alone or two or more of the compounds containing Mn may be used either singly or in combination. Among these, a carbonate and an oxide are preferred from the viewpoint of easy handleability. In particular, a carbonate containing Mn ($MnCO_3$) is more preferred. This is because, the stability carbonate containing Mn in air is good, the carbonate can be easily decomposed by heating, elements except the intended composition hardly remain, and the light emitting luminance can be readily prevented from being lowered by residual impurity elements.

Compound Containing Eu

Examples of the compound containing Eu may include an oxide, a hydroxide, a carbonate, a nitrate, a sulfate, a halide, and a nitride, each containing Eu. The compound containing Eu may be optionally used. The compounds containing Eu may be in the form of a hydrate. Specifically, the compound may include EuO, $Eu_2O_3$, $Eu(OH)_3$, $Eu_2(CO_3)_3$, $Eu(NO_3)_3$, $Eu_2(SO_4)_3$, $EuCl_2$, $EuF_3$. One alone or two or more of the compounds containing Eu may be used either singly or in combination. Among these, a carbonate and an oxide are preferred from the viewpoint of easy handleability. In particular, an oxide containing Eu ($Eu_2O_3$) is more preferred. This is because, the stability the oxide containing Eu in air is good, elements except the intended composition hardly remain, and the light emitting luminance can be readily prevented from being lowered by residual impurity elements.

Compound Containing Al

Examples of the compound containing Al may include an oxide, a hydroxide, a nitride, an oxynitride, a fluoride, and a chloride, each containing Al. These compounds may be in the form of a hydrate. As the compound containing Al, an aluminum metal simple substance or an aluminum alloy may be used, and the metal simple substance or the alloy may be used in place of at least a part of the compound.

Specifically, the compound containing Al may include $Al_2O_3$, $Al(OH)_3$, AlN, AlON, $AlF_3$, $AlCl_3$. One alone or two or more of the compounds containing Al may be used either singly or in combination. The compound containing Al is preferably an oxide ($Al_2O_3$). This is because, differing from other materials, the oxide does not contain any other element than the intended composition of an aluminate fluorescent material, and a fluorescent material having an intended composition is easy to obtain. In the case of using a compound containing some other elements than the intended composition, residual impurity elements may remain in the resultant fluorescent material, the residual impurity elements may be killer elements against light emission, and the light emitting luminance may be extremely lowered.

Compound Containing Mg

Examples of the compound containing Mg may include an oxide, a hydroxide, a carbonate, a nitrate, a sulfate, a carboxylate, a halide, and a nitride, each containing Mg. The compound containing Mg may be optionally used. The compounds containing Mg may be in the form of a hydrate. Specifically, the compound may include MgO, $Mg(OH)_2$, $3MgCO_3Mg(OH)_2 \cdot 3H_2O$, $MgCO_3Mg(OH)_2$, $Mg(NO_3)_2 \cdot 6H_2O$, $MgSO_4$, $Mg(OCO)_2H_2O$, $Mg(OCOCH_3)_2 \cdot 4H_2O$, $MgCl_2$, $Mg_3N_2$, MgNH. One alone or two or more of the compounds containing Mg may be used either singly or in combination. Among these, a carbonate and an oxide are preferred from the viewpoint of easy handleability, and in particular, an oxide containing Mg (MgO) is more preferred. This is because, the stability the oxide containing Mg in air is good, elements except the intended composition hardly remain, and the light emitting luminance can be readily prevented from being lowered by residual impurity elements.

First Flux

A fluoride containing at least one alkaline metal element selected from the group consisting of Na, K, Rb, and Cs is used as a first flux. With this arrangement, together with a second flux to be described below, reaction among the raw materials can be promoted, solid-phase reaction can progress uniformly, and thus the aluminate fluorescent material having a high light emission intensity can be produced. It is presumed that, with the fluoride containing at least one alkaline metal element selected from the group consisting of Na, K, Rb, and Cs, the reaction among the raw materials in the mixture is promoted, and crystal growth of the fluorescent material particles progresses. Further, with the fluoride containing at least one alkaline metal element selected from the group consisting of Na, K, Rb, and Cs, in the hexagonal crystal structure of the aluminate fluorescent material, a crystal is easily grown in the c-axis direction and/or in the in-plane direction, and thus the aluminate fluorescent material having a high light emission intensity can be produced. Specific example of the first flux may be at least one fluoride selected from the group consisting of NaF, KF, RbF, and CsF. Among these, the first flux is preferably at least one selected from NaF and KF, which are relatively inexpensive and are easy in handleability.

Second Flux

A fluoride containing at least one element selected from the group consisting of Ba, Sr, Ca, Mg, and Al, which is different from the compound containing the alkaline earth metal element, the compound containing Mg, and the compound containing Al, is used as a second flux. Together with the first flux, a fluoride containing at least one element selected from the group consisting of Ba, Sr, Ca, Mg, and Al, which may constitute a framework of the crystal structure in the aluminate fluorescent material, is used as a second flux. With this arrangement, growth of the crystal structure in the aluminate fluorescent material can be further promoted while promoting reaction among the raw materials in the mixture, and thus the aluminate fluorescent material having a high light emission intensity can be produced. Specific example of the second flux may be at least one fluoride selected from the group consisting of $BaF_2$, $SrF_2$, $CaF_2$, $MgF_2$, and $AlF_3$. Among these, the second flux is preferably at least one selected from $MgF_2$ and $AlF_3$, which are relatively inexpensive.

When the mixture of the raw materials contains: the first flux, which is a fluoride containing at least one alkaline metal element selected from the group consisting of Na, K, Rb, and Cs; and the second flux, which is a fluoride containing at least one element selected from the group consisting of Ba, Sr, Ca, Mg, and Al (excluding the case where the first flux is a fluoride containing K and the second flux is a fluoride containing Al), the fluorine content in the mixture is in a range of 3,000 ppm or more and 15,500 ppm or less.

When the fluorine content in the mixture is less than 3,000 ppm, the crystal growth is not promoted, the particle diameter becomes small, and the light emission intensity is decreased. When the fluorine content in the mixture is more than 15,500 ppm, an adverse effect due to penetrating of fluorine into the crystal structure occurs, and thus an aluminate fluorescent material of which the light emission intensity is decreased may be produced.

In the method of producing an aluminate fluorescent material according to the fourth embodiment of the present disclosure, when the first flux is a fluoride containing K and the second flux is a fluoride containing Al, both the first flux and the second flux easily promote the reaction of the raw materials in the mixture by a heat treatment of the mixture, and easily promote the crystal growth. When the mixture of the raw materials contains the first flux, which is a fluoride containing K, and the second flux, which is a fluoride containing Al, the fluorine content in the mixture is in a range of 3,000 ppm or more and 8,500 ppm or less.

When the fluorine content in the mixture is less than 3,000 ppm, the crystal growth is not promoted, the particle diameter becomes small, and the light emission intensity is decreased. When the fluorine content in the mixture is more than 8,500 ppm, an adverse effect due to penetrating of fluorine into the crystal structure occurs, and thus an aluminate fluorescent material of which the light emission intensity is decreased may be produced.

A molar ratio of the first flux and the second flux (first flux:second flux) each contained in the mixture is, when a molar ratio of the compound containing at least one alkaline earth metal element selected from the group consisting of Ba, Sr, and Ca, which is different from the fluoride serving as the second flux, is used as a basis (1 mol), preferably in a range of 1:0.2 or more and 1:15 or less, more preferably in a range of 1:0.3 or more and 1:12 or less, even more preferably in a range of 1:0.4 or more and 1:10 or less, from the viewpoint of promoting the reaction of the mixture.

In the case where the first flux is a fluoride containing at least one alkaline metal element selected from the group consisting of Na, K, Rb, and Cs; and the second flux is a fluoride containing at least one element selected from the group consisting of Ba, Sr, Ca, Mg, and Al (excluding the case where the first flux is a fluoride containing K and the second flux is a fluoride containing Al), a molar ratio of the first flux and the second flux (first flux:second flux) each contained in the mixture is, when a molar ratio of the compound containing at least one alkaline earth metal element selected from the group consisting of Ba, Sr, and Ca, which is different from the fluoride serving as the second flux, is used as a basis (1 mol), preferably in a range of 1:0.4 or more and 1:15 or less, more preferably in a range of 1:0.5 or more and 1:12 or less, even more preferably in a range of 1:1 or more and 1:10 or less.

In the case where the first flux is a fluoride containing K and the second flux is a fluoride containing Al, a molar ratio of the first flux and the second flux (first flux:second flux) each contained in the mixture is, when a molar ratio of the compound containing at least one alkaline earth metal element selected from the group consisting of Ba, Sr, and Ca is used as a basis (1 mol), preferably in a range of 1:0.2 or more and 1:15 or less, more preferably in a range of 1:0.3 or more and 1:12 or less, even more preferably in a range of 1:0.4 or more and 1:10 or less.

Mixing of Compounds

In the case where the aluminate fluorescent material contains a compound containing at least one alkaline earth metal element selected from the group consisting of Ba, Sr, and Ca, a compound containing Mn, optionally a compound containing Eu, a compound containing Al, optionally a compound containing Mg, the first flux, and the second flux (excluding the case where the first flux is a fluoride containing K and the second flux is a fluoride containing Al), the respective raw materials are mixed such that the molar ratio of each of the compounds other than the first flux and the second flux satisfies the composition of the aluminate fluorescent material and the fluoride content in the mixture falls within a range of 3,000 ppm or more and 15,500 ppm or less, thereby producing a mixture. It is preferred that the respective raw materials are mixed such that the composition of the aluminate fluorescent material satisfies the composition represented by the formula (I). Specific examples of the desired composition may include $Ba_{1.0}Mn_{0.5}Al_{10}O_{16.5}$ etc. A total molar ratio of the first flux and the second flux (excluding the case where the first flux is a fluoride containing K and the second flux is a fluoride containing Al) may not be particularly limited as long as the fluoride content in the mixture falls within a range of 3,000 ppm or more and 15,500 ppm or less. The total molar ratio of the first flux and the second flux is preferably 1.5 mol or less, more preferably 1.2 mol or less, even more preferably 1 mol or less, and preferably 0.01 mol or more, more preferably 0.02 mol or more, even more preferably 0.05 mol or more, when a molar ratio of the compound containing at least one alkaline earth metal element selected from the group consisting of Ba, Sr, and Ca is used as a basis (1 mol).

In the case where the aluminate fluorescent material contains a compound containing at least one alkaline earth metal element selected from the group consisting of Ba, Sr, and Ca, a compound containing Mn, optionally a compound containing Eu, a compound containing Al, optionally a compound containing Mg, the first flux, which is a fluoride containing K, and the second flux, which is a fluoride containing Al, the respective raw materials are mixed such that the molar ratio of each of the compounds other than the first flux and the second flux satisfies the composition of the aluminate fluorescent material and the fluoride content in the mixture falls within a range of 3,000 ppm or more and 8,500 ppm or less, thereby producing a mixture. It is preferred that the respective raw materials are mixed such that the composition of the aluminate fluorescent material satisfies the composition represented by the formula (I). Specific examples of the desired composition may include $Ba_{1.0}Mn_{0.5}Al_{10}O_{16.5}$ etc. A total molar ratio of the first flux, which is a fluoride containing K, and the second flux, which is a fluoride containing Al, may not be particularly limited as long as the fluoride content in the mixture falls within a range of 3,000 ppm or more and 8,500 ppm or less. The total moral ratio of the first flux and the second flux is preferably 1.5 mol or less, more preferably 1.2 mol or less, even more preferably 1 mol or less, and preferably 0.01 mol or more, more preferably 0.02 mol or more, even more preferably 0.05 mol or more, when a molar ratio of the compound containing at least one alkaline earth metal element selected from the group consisting of Ba, Sr, and Ca is used as a basis (1 mol).

For the mixture, the compounds each containing the intended elements, the first flux, and the second flux are weighed so as to be a desired blending ratio, and may subsequently be ground and mixed using a dry-type grinder such as a ball mill, a vibration mill, a hammer mill, a roll mill, or a jet mill; may be ground and mixed using a mortar, a pestle; may be mixed using a mixing machine such as a ribbon blender, a Henschel mixer, or a V-shaped blender; or may be ground and mixed using both the dry-type grinder and the mixing machine. The mixing may be dry-type mixing, or may also be wet-type mixing with a solvent added thereto. The dry-type mixing is preferred. This is because the processing time can be shortened more in the dry-type mixing than in the wet-type mixing, thereby leading to productivity improvement.

Heat-Treating of Mixture

The mixture can be heat-treated in a crucible or a boat formed of carbo material such as graphite, boron nitride (BN), aluminum oxide (alumina), tungsten (W), or molybdenum (Mo).

From the viewpoint of stability of the crystal structure, the temperature at which the mixture is heat-treated is preferably in a range of 1,000° C. or more and 1,800° C. or less, more preferably in a range of 1,100° C. or more and 1,750° C. or less, even more preferably in a range of 1,200° C. or more and 1,700° C. or less, still more preferably in a range of 1,300° C. or more and 1,650° C. or less.

The heat-treating time may vary depending on factors such as the heating rate, and the heat treatment atmosphere. The heat-treating time after reaching at the heat treatment temperature is preferably 1 hour or more, more preferably 2 hours or more, even more preferably 3 hours or more, and preferably 20 hours or less, more preferably 18 hours or less, even more preferably 15 hours or less.

The atmosphere where the mixture is heat-treated may be an inert atmosphere containing argon and/or nitrogen; a reducing atmosphere containing hydrogen; or an oxidizing atmosphere such as air. It is preferred that the mixture is heat-treated in a nitrogen atmosphere having reducing properties to obtain a fluorescent material. The atmosphere where the mixture is heat-treated is more preferably a hydrogen gas-containing nitrogen atmosphere having reducing properties.

In the aluminate fluorescent material, the mixture can be more reactive in an atmosphere having a high reducing power such as in a reducing atmosphere containing hydrogen and nitrogen, and can be heat-treated under an atmospheric pressure without pressurization. For the heat treatment, for example, an electric furnace, a gas furnace can be used.

Post Treatment

The resultant fluorescent material may be wet dispersed and subjected to post treatment steps such as wet-type sieving, dehydration, drying, and dry-type sieving. According to these post treatment steps, a fluorescent material having a desired average particle diameter can be obtained. For example, the fluorescent material after the heat treatment is dispersed in a solvent; the dispersed fluorescent material is set on a sieve; the solvent flow is allowed to flow while applying a variety of vibrations via the sieve; thereby subjecting the calcined product to mesh passing to achieve wet-type sieving; and subsequently, dehydration, drying, and dry-type sieving are performed. The fluorescent material having a desired average particle diameter can be thus obtained.

By dispersing the fluorescent material after the heat treatment in a medium, impurities such as a calcination residue of the flux and unreacted components of the raw materials can be removed. For the wet-type dispersion, a dispersion medium such as an alumina ball or a zirconia ball may be used.

EXAMPLES

The present invention is hereunder specifically described by reference to the following Examples and Comparative Examples. The present invention is not limited to these Examples.

Comparative Example 1

In order to set the charge-in composition to be a composition represented by $Ba_{1.0}Mn_{0.5}Al_{10}O_{16.5}$, $BaCO_3$, $Al_2O_3$, and $MnCO_3$ were used as raw materials, a flux was not used, and the respective raw materials were mixed such that the respective raw materials could have a molar ratio shown in Table 1, on the basis of Ba (1 mol), thereby obtaining a mixture. The resultant mixture was filled in an alumina crucible and the crucible was closed with a lid. The resultant mixture in the crucible was then heat-treated at 1,500° C. for 5 hours in a mixed atmosphere of 3% by volume of $H_2$ and 97% by volume of $N_2$, thereby obtaining an aluminate fluorescent material of Comparative Example 1.

Examples 1, 2, and Comparative Example 2

In order to set the charge-in composition to be a composition represented by $Ba_{1.0}Mn_{0.5}Al_{10}O_{16.5}$, $BaCO_3$, $Al_2O_3$, and $MnCO_3$ were used as raw materials, NaF was used as a first flux, $AlF_3$ was used as a second flux, and the respective raw materials were mixed such that the respective raw materials, the first flux, and the second flux could have a molar ratio shown in Table 1, on the basis of Ba (1 mol), thereby obtaining a mixture. The content of fluorine in the mixture is shown in Table 1. The resultant mixture was filled in an alumina crucible and the crucible was closed with a lid. The resultant mixture in the crucible was then heat-treating at 1,500° C. for 5 hours in a mixed atmosphere of 3% by volume of $H_2$ and 97% by volume of $N_2$, thereby obtaining an aluminate fluorescent material of each of Examples 1, 2, and Comparative Example 2.

Example 3, Comparative Examples 3 and 4

In order to set the charge-in composition to be a composition represented by $Ba_{1.0}Mn_{0.5}Al_{10}O_{16.5}$, $BaCO_3$, $Al_2O_3$, and $MnCO_3$ were used as raw materials, KF was used as a first flux, $AlF_3$ was used as a second flux, and the respective raw materials were mixed such that the respective raw materials, the first flux, and the second flux could have a molar ratio shown in Table 1, on the basis of Ba (1 mol), thereby obtaining a mixture. The content of fluorine in the mixture is shown in Table 1. The resultant mixture was filled in an alumina crucible and the crucible was closed with a lid. The resultant mixture in the crucible was then heat-treating at 1,500° C. for 5 hours in a mixed atmosphere of 3% by volume of $H_2$ and 97% by volume of $N_2$, thereby obtaining an aluminate fluorescent material of each of Example 3, Comparative Examples 3 and 4.

Comparative Example 5

In order to set the charge-in composition to be a composition represented by $Ba_{1.0}Mg_{0.5}Mn_{0.5}Al_{10}O_{16.5}$, $BaCO_3$, $Al_2O_3$, MgO, and $MnCO_3$ were used as raw materials, a flux was not used, and the respective raw materials were mixed such that the respective raw materials could have a molar ratio shown in Table 1, on the basis of Ba (1 mol), thereby obtaining a mixture. The content of fluorine in the mixture is shown in Table 1. The resultant mixture was filled in an alumina crucible and the crucible was closed with a lid. The resultant mixture in the crucible was then heat-treating at 1,500° C. for 5 hours in a mixed atmosphere of 3% by volume of $H_2$ and 97% by volume of $N_2$, thereby obtaining an aluminate fluorescent material of Comparative Example 5.

Examples 4 to 6, Comparative Examples 6 and 7

In order to set the charge-in composition to be a composition represented by $Ba_{1.0}Mg_{0.5}Mn_{0.5}Al_{10}O_{17}$, $BaCO_3$, $Al_2O_3$, MgO, and $MnCO_3$ were used as raw materials, KF was used as a first flux, $MgF_2$ was used as a second flux, and the respective raw materials were mixed such that the respective raw materials, the first flux, and the second flux could have a molar ratio shown in Table 1, on the basis of Ba (1 mol), thereby obtaining a mixture. The content of fluorine in the mixture is shown in Table 1. The resultant mixture was filled in an alumina crucible and the crucible was closed with a lid. The resultant mixture in the crucible was then heat treating at 1,500° C. for 5 hours in a mixed atmosphere of 3% by volume of $H_2$ and 97% by volume of $N_2$, thereby obtaining an aluminate fluorescent material of each of Examples 4 to 6, Comparative Examples 6 and 7.

Evaluation of Average Particle Diameter D

As to the aluminate fluorescent material according to each of Examples and Comparative Examples, using a Fisher Sub-Sieve Sizer Model 95 (manufactured by Fisher Scientific Inc.), the aluminate fluorescent material was sampled in an amount of 1 cm$^3$ in an environment where the temperature was 25° C. and the humidity was 70% RH, and packed in a dedicated tubular container, then a dry air flow was introduced therein under a constant pressure to read a specific surface area of the sample from the differential pressure, and thus a value expressed in terms of the average particle diameter D according to the FSSS method was obtained. The results are shown in Table 1.

Evaluation of 50% Volume Particle Diameter D50

As to the aluminate fluorescent material according to each of Examples and Comparative Examples, using a laser diffraction particle size distribution measuring apparatus (Mastersizer 3000, manufactured by Malvern Instruments Ltd.), the 50% volume particle diameter (D50: median diameter) at a cumulative volume frequency of 50% from the small-diameter side was measured. The results are shown in Table 1.

Evaluation of Light Emission Characteristics

Measurement of Light Emission Spectrum

Figure 2:
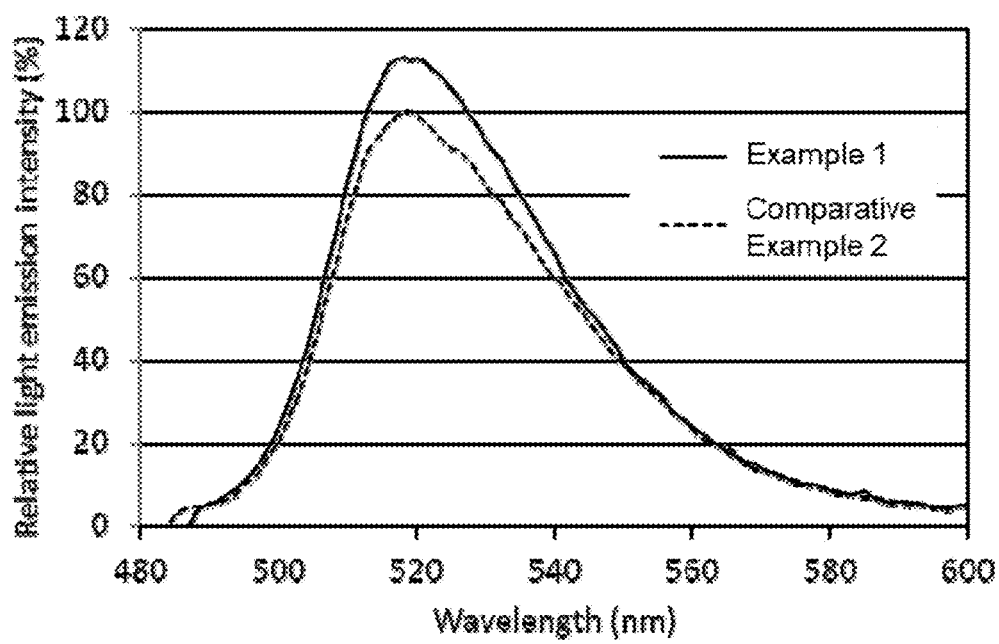
FIG. 2 shows light emission spectra of aluminate fluorescent materials according to Example 1 according to an embodiment of the present disclosure and Comparative Example 2.

As to the aluminate fluorescent material according to each of Examples and Comparative Examples, the light emission characteristics thereof were measured. Using a quantum efficiency measuring apparatus (QE-2000, manufactured by Otsuka Electronics Co., Ltd.), each fluorescent material was irradiated with light having an excitation wavelength of 450 nm to measure the light emission spectrum thereof at room temperature (25° C.±5° C.). The full width at half maximum of the light emission spectrum of the relative light emission intensity (%) to wavelength of the aluminate fluorescent material according to each of Examples and Comparative Examples was measured. The results are shown in Table 1. The light emission spectrum of the aluminate fluorescent material according to each of Examples and Comparative Examples has a light emission peak wavelength in a range of 510 nm or more and 525 nm or less. FIG. 2 shows the light emission spectra of the relative light emission intensity (%) to wavelength of the aluminate fluorescent materials of Example 1 and Comparative Example 2.

Relative Light Emission Intensity (%)

As to the aluminate fluorescent material according to each of Examples 1 to 3 and Comparative Examples 1 to 4, the relative light emission intensity thereof was calculated from the measured light emission spectrum, when the light emission intensity at the light emission peak wavelength in Comparative Example 2 was taken as 100%. The results are shown in Table 1.

Further, as to the aluminate fluorescent material according to each of Examples 4 to 6 and Comparative Examples 5 to 7, the relative light emission intensity thereof was calculated from the measured light emission spectrum, when the light emission intensity at the light emission peak wavelength in Comparative Example 7 was taken as 100%. The results are shown in Table 1.

Fluorine Content

As to the fluorine content of the mixture for forming the aluminate fluorescent material according to each of Examples and Comparative Examples, as well as the fluorine content of the aluminate fluorescent material according to each of Examples and Comparative Examples, the quantitative analysis was performed using an ion chromatography (manufactured by Dionex Corp.). The results are shown in Table 1.

Analysis conditions of the ion chromatography are as follows.

Column: Ion Pack AS12 (4 mm)

Eluent 2.7 mM:$Na_2CO_3$, 0.3 mM:$NaHCO_3$

Suppressor: used

Column temperature: 35° C.

Detection: electric conductivity detector

SEM Micrograph

Figure 3:
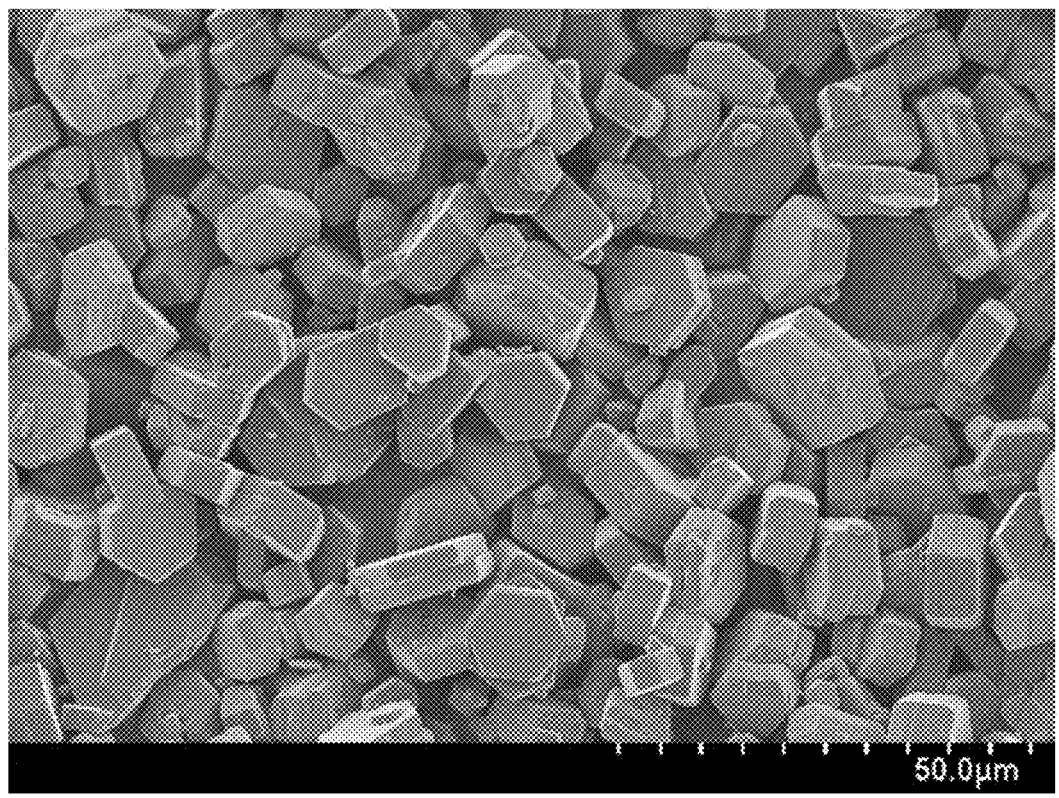
FIG. 3 is a SEM micrograph showing an aluminate fluorescent material according to Example 1 according to an embodiment of the present disclosure.
Figure 4:
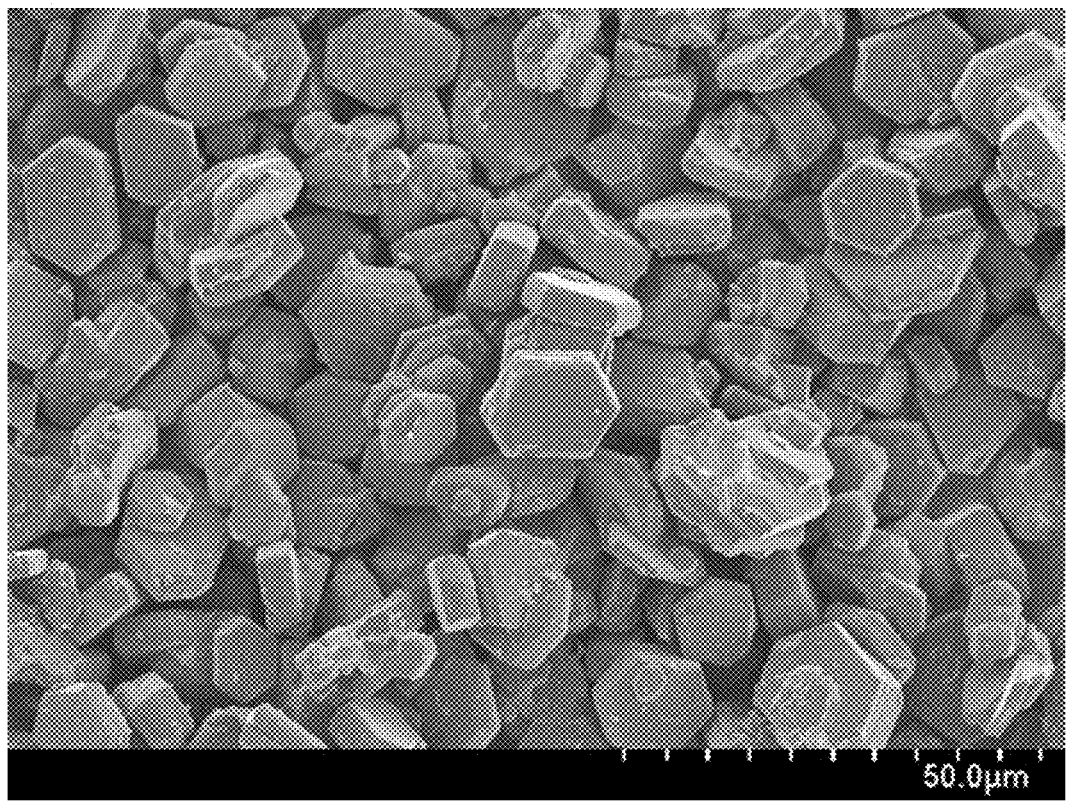
FIG. 4 is a SEM micrograph showing an aluminate fluorescent material according to Comparative Example 2.

Using a scanning electron microscope (SEM), SEM micrographs of the aluminate fluorescent material in Example 1 and the aluminate fluorescent material in Comparative Example 2 were obtained. FIG. 3 is a SEM micrograph showing the aluminate fluorescent material according to Example 1, and FIG. 4 is a SEM micrograph showing the aluminate fluorescent material according to Comparative Example 2.

TABLE 1

| | Flux (molar ratio) | | | | Charge-in composition (molar ratio) | | | | Fluorine (F) content (ppm) | | Particle diameter | | Light emission characteristics | |
|---|---|---|---|---|---|---|---|---|---|---|---|---|---|---|
| | Second flux | First flux | | | | | | | | | Average particle diameter D | 50% volume particle diameter D50 | Relative light emission intensity | Full width at half maximum |
| | $AlF_3$ | $MgF_2$ | NaF | KF | Ba | Mg | Mn | Al | Mixture | Aluminate fluorescent material | (μm) | (μm) | (%) | (nm) |
| Comparative Example 1 | — | — | — | — | | | | | — | <30 | 1.4 | 5.0 | 34.4 | 40 |
| Example 1 | 0.067 | — | 0.05 | — | 1.000 | 0 | 0.5 | 10 | 6,147 | 2,500 | 10.4 | 16.4 | 113.2 | 37 |
| Example 2 | 0.100 | | | | | | | | 8,560 | 4,600 | 10.0 | 15.2 | 104.7 | 37 |
| Comparative Example 2 | 0.200 | | | | | | | | 15,830 | 8,500 | 10.4 | 16.5 | 100.0 | 38 |

TABLE 1-continued

| | Flux (molar ratio) | | | | Charge-in composition (molar ratio) | | | | Fluorine (F) content (ppm) | | Particle diameter | | Light emission characteristics | |
|---|---|---|---|---|---|---|---|---|---|---|---|---|---|---|
| | Second flux | | First flux | | | | | | | | Average particle diameter D | 50% volume particle diameter D50 | Relative light emission intensity | Full width at half maximum |
| | AlF$_3$ | MgF$_2$ | NaF | KF | Ba | Mg | Mn | Al | Mixture | Aluminate fluorescent material | (μm) | (μm) | (%) | (nm) |
| Example 3 | 0.067 | — | — | 0.05 | | | | | 6,141 | 2,600 | 8.6 | 18.6 | 111.1 | 35 |
| Comparative Example 3 | 0.100 | | | | | | | | 8,552 | 4,200 | 7.4 | 14.6 | 101.9 | 37 |
| Comparative Example 4 | 0.200 | | | | | | | | 15,815 | 7,500 | 7.8 | 15.3 | 94.5 | 39 |
| Comparative Example 5 | — | — | — | — | 1.000 | 0.5 | 0.5 | 10 | — | <30 | 1.5 | 4.6 | 30.4 | 28 |
| Comparative Example 6 | — | 0.010 | — | 0.05 | | | | | 1,674 | 50 | 10.8 | 21.1 | 92.8 | 29 |
| Example 4 | | 0.050 | | | | | | | 3,584 | 550 | 11.0 | 19.2 | 114.4 | 28 |
| Examples | | 0.100 | | | | | | | 5,965 | 1,200 | 11.4 | 19.8 | 122.6 | 28 |
| Example 6 | | 0.300 | | | | | | | 15,427 | 4,500 | 11.2 | 19.7 | 118.7 | 29 |
| Comparative Example 7 | | 0.500 | | | | | | | 24,789 | 9,200 | 10.2 | 19.3 | 100.0 | 30 |

As shown in Table 1, in each of the aluminate fluorescent materials according to Examples 1 to 3 and Examples 4 to 6, the fluxes in the mixture during the heat treatment are in such amounts that the fluorine content in the aluminate fluorescent material became in a range of 100 ppm or more and 7,000 ppm or less. Thus, in each of the aluminate fluorescent materials according to Examples 1 to 3 and Examples 4 to 6, the particles were sufficiently grown, the average particle diameter D was large as 8 μm or more, and the relative light emission intensity became high by absorbing excitation light in the blue region.

As shown in Table 1, in each of the aluminate fluorescent materials of Comparative Examples 1 and 5, since the flux was not used during the heat treatment, the particles were not sufficiently grown, and thus the relative light emission intensity became low.

As shown in Table 1, in the aluminate fluorescent material of Comparative Example 6, the amount of the second flux was small, the content of fluorine in the mixture was not reached at 3,000 ppm, and thus the relative light emission intensity was decreased.

As shown in Table 1, in each of the aluminate fluorescent materials of Comparative Examples 2, 4, and 7, the amount of the first flux and the second flux, which were present during the heat treatment, was large, the content of fluorine in the aluminate fluorescent material was more than 7,000 ppm, and thus the relative light emission intensity was not as high as those of the aluminate fluorescent materials according to Examples 1 to 3 or Examples 4 to 6.

Further, as shown in Table 1, in the aluminate fluorescent material of Comparative Example 3, KF was used as the first flux and AlF$_3$ was used as the second flux, the amount of the first flux and the second flux, which were present during the heat treatment, was too large, and thus the relative light emission intensity was not as high as those of the aluminate fluorescent materials according to Examples 1 to 3 and Examples 4 to 6.

It is presumed that, when the content of fluorine in the aluminate fluorescent material was large as more than 7,000 ppm, the fluorines used as the first flux and the second flux could promote the crystal growth of the aluminate fluorescent material, but on the other hand, the relative light emission intensity was decreased by hindering the light emission since the fluorines were excessively present.

As shown in FIG. 2, it can be confirmed that the light emission spectrum of the aluminate fluorescent material according to Example 1 has a high light emission intensity as compared with the light emission spectrum of the aluminate fluorescent material according to Comparative Example 2.

As shown in the SEM micrographs of FIG. 3 and FIG. 4, the aluminate fluorescent materials according to Example 1 and Comparative Example 2 include a tabular crystal having at least one hexagonal face and showing a hexagonal crystal structure. As shown in the SEM micrograph of FIG. 3, it can be confirmed that the number of fine particles adhered on the surface of the aluminate fluorescent material according to Example 1 is small, as compared with the aluminate fluorescent material according to Comparative Example 2, which is shown in the SEM micrograph of FIG. 4.

From the above results, an aluminate fluorescent material having a high light emission intensity through photoexcitation in the blue region can be obtained.

The light emitting device using the aluminate fluorescent material according to the embodiment of the present invention has a high light emission intensity through photoexcitation in the blue region, and can be used in a broad field of ordinary lightings, in-car lightings, displays, backlights for liquid-crystal devices, traffic lights, illumination-type switches.

The invention claimed is:
1. An aluminate fluorescent material, comprising an aluminate composition comprising:
at least one alkaline earth metal element selected from the group consisting of Ba, Sr, and Ca;
Mn; and
optionally Eu and/or Mg,
wherein a fluorine content in the aluminate fluorescent material is in a range of 100 ppm or more and 7,000 ppm or less, and wherein an average particle diameter of the aluminate fluorescent material, which is measured according to a Fisher Sub-Sieve Sizer method, is 8 μm or more.

2. The aluminate fluorescent material according to claim 1, wherein the aluminate composition is represented by the following formula (I):

$$X^1_p Eu_t Mg_q Mn_r Al_s O_{p+t+q+r+1.5s} \quad (I)$$

wherein $X^1$ represents at least one element selected from the group consisting of Ba, Sr, and Ca; and p, q, r, s, and t each satisfy $0.5 \leq p \leq 1.0$, $0 \leq q \leq 0.7$, $0.3 \leq r \leq 0.7$, $8.5 \leq s \leq 13.0$, $0 \leq t \leq 0.5$, $0.5 \leq p+t \leq 1.2$, and $0.3 < q+r \leq 1.0$.

3. The aluminate fluorescent material according to claim 2, wherein in the formula (I), $X^1$ comprises Ba, and p satisfies $0.6 \leq p \leq 1.0$.

4. The aluminate fluorescent material according to claim 2, wherein in the formula (I), r satisfies $0.4 \leq r \leq 0.6$.

5. The aluminate fluorescent material according to claim 2, wherein in the formula (I), t satisfies $0 < t \leq 0.5$.

6. The aluminate fluorescent material according to claim 1, wherein a 50% volume particle diameter D50, which is measured according to a laser diffraction particle size distribution measuring method, is in a range of 15 μm or more and 50 μm or less.

7. A light emitting device, comprising: a fluorescent member comprising the aluminate fluorescent material according to claim 1; and an excitation light source having a light emission peak wavelength in a range of 380 nm or more and 485 nm or less.

* * * * *